United States Patent [19]
Soejima et al.

[11] Patent Number: 4,933,729
[45] Date of Patent: Jun. 12, 1990

[54] PHOTOINTERRUPTER

[75] Inventors: Katsutoshi Soejima, Tokyo; Shunichi Yakata, Kumamoto; Yoichi Sakumura, both of Kumamoto, all of Japan

[73] Assignee: NEC Corporation, Tokyo, Japan

[21] Appl. No.: 275,622

[22] Filed: Nov. 15, 1988

Related U.S. Application Data

[63] Continuation of Ser. No. 933,452, Nov. 21, 1986, abandoned.

[30] Foreign Application Priority Data

Nov. 21, 1985 [JP] Japan ................... 60-262851

[51] Int. Cl.$^5$ ............................................ H01L 31/12
[52] U.S. Cl. ...................................... 357/19; 357/17; 357/72; 357/70
[58] Field of Search .................. 357/17, 19, 72, 70

[56] References Cited

FOREIGN PATENT DOCUMENTS

| | | | |
|---|---|---|---|
| 53-14588 | 9/1978 | Japan | 357/17 |
| 54-134992 | 10/1979 | Japan | 357/17 |
| 59-18683 | 1/1984 | Japan | 357/19 |
| 59-88876 | 5/1984 | Japan | 357/19 |
| 0094886 | 5/1984 | Japan | 357/19 |
| 59-94886 | 5/1984 | Japan | 357/19 |
| 59-121984 | 7/1984 | Japan | 357/19 |
| 59-195882 | 11/1984 | Japan | 357/19 |
| 60-241278 | 11/1985 | Japan | 357/17 |
| 0229883 | 10/1987 | Japan | 357/19 |

Primary Examiner—Rolf Hille
Assistant Examiner—Hoanganh Le
Attorney, Agent, or Firm—Sughrue, Mion, Zinn, Macpeak & Seas

[57] ABSTRACT

In a photointerrupter provided with a resin-molded single package, emitter leads for a light emitting element and a detector leads for a light detecting element are disposed substantially on the same plane so that the light emitting element and the light detecting element are disposed in side-by-side relationship. Preferably, the emitter leads and the detector leads are derived from the same plane of the resin-molde package, and all the leads are arrayed on a straight line like a single in-line package device.

6 Claims, 3 Drawing Sheets

FIG 1A PRIOR ART
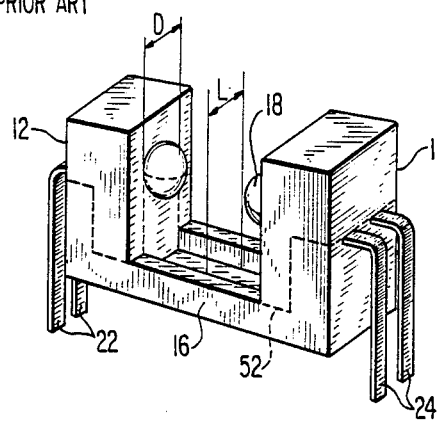
FIG 1B PRIOR ART
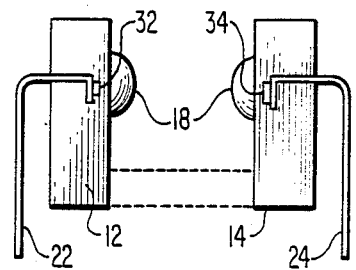
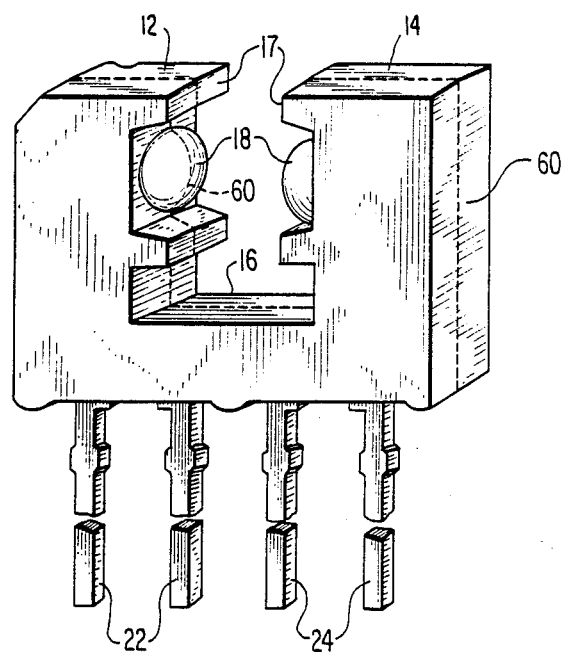
FIG 2

PHOTOINTERRUPETER

This is a continuation, of application Ser. No. 06/933,452 filed Nov. 21, 1986, now abandoned.

BACKGROUND OF THE INVENTION

The present invention relates to a photointerrupter, and more particularly to a photointerrupter having a novel terminal arrangement.

In a conventional photointerrupter, a light emitting portion and a light detecting portion are prepared separately and then assembled into a unit package such that they are spaced one from the other and coupled with respect to radiation created and detected thereby, by an air gap region. However, such a conventional photointerrupter makes it difficult to ensure an alignment of optical axes of the light emitting portion and the light detecting portion, and in addition the assembling work is complicated.

To this end, an improved structure is illustrated, for example, in Japanese Laid-Open Patent Application No. 88876/1984 dated May 22, 1984, wherein a semiconductor light emitting element (an emitter pellet) and a semiconductor light detecting element (a detector pellet) are mounted on a lead frame and resin-sealed in common to form a resin molded single package. As shown in FIG. 1A and FIG. 1B, an emitter portion 12, a detector portion 14 and a bridge portion 16 are formed commonly by a transfer molding using a two-split metal mold. Emitter leads 22 and detector leads 24 are derived from opposite side surfaces of the resin-molded package. The emitter leads 22 are bent rectangularly at a portion where a emitter pellet 32 is mounted so as to be in face-to-face relationship with the detector portion 14. Similarly, the detector leads 24 are bent rectangularly at a portion where a detector pellet 34 is mounted so as to be in face-to-face relationship with the emitter portion 14. Then, a construction is such that the emitter pellet 32 and the detector pellet 34 mounted each in opposite mounting areas of both the leads are photocoupled through each convex lens 18. In the example, the bridge portion 16 must have an opening at the center for simultaneous formation of the lenses 18 by means of a two-split metal mold, and a width L of the opening should be formed greater than a diameter D of the each lens 18.

While the photointerrupter with the aforementioned structure attains a resin-molded single package with convex lenses by using a two-split metal mold, the following problems still remain unsolved.

The emitter pellet and the detector pellet are mounted on the common lead frame, and after a predetermined wire bonding is carried out thereon, the lead frame must be bent rectangularly so as to make each mounting area in a face-to-face relationship, however, if it is bent after mounting, the bending strain is capable of exerting an influence on the pellet mounting areas, thus deteriorating a reliability of bonding strength and pellet function. It would be conceivable that the lead frame be bent before mounting. However, the emitter lead frame and the detector lead frame must be separated in such a case, how to mate both the two may be problematical incidentally, and further processes for mounting and wire bonding become intricate in addition, and hence the method is unadvisable.

Further, all leads must be bent again in the same direction like a dual in-line package of the type commonly employed for housing semiconductor devices. However, since the bending process follows the resin-molding process, a bend is provided at a predetermined position spaced apart from a derived end portion so as not to cause a crack on the resin part. Therefore the photointerrupter may inevitably be of considerable dimensions in the direction of optical axis.

Moreover, since the opening is in enevitably at the bridge portion for forming the convex lenses simultaneously at the molding process, mechanical strength of the bridge portion becomes weak. For reinforcement, the photointerrupter must be increased in dimensions perpendicular to the optical axis.

As described, the structure of the resin-molded photointerrupter package proposed by the prior art has not yet been commercialized particularly for intricateness of the manufacturing process, and in addition the product itself gets inevitably large-sized.

SUMMARY OF THE INVENTION

An object of the invention is to provide a photointerrupter with a resin-molded single package which is adaptable to a mass productivity.

Another object of the invention is to provide a photointerrupter with a resin-molded structure of a size smaller than the prior art, which is thin in a direction perpendicular to optical axis.

One of the features of the invention is that pellet-mounting areas of leads in emitter and detector portions are disposed substantially on the same plane within a package. Accordingly, the construction is such that the emitter pellet and the detector pellet are photocoupled in side-by-side relationship and the mounting areas of the leads are not disposed in face-to-face relationship, so that the structure is suitable to mass production.

Another feature of the invention is that all leads are derived from the same plane of the molded resin and arrayed on a straight line to provide a single in-line package. Therefore the sizes in a direction of optical axis and a perpendicular direction thereto can be minimized.

In order to attain enhancement of an optocoupling efficiency, it is preferable to provide a reflection portion in the leads for mounting the pellets. That is, the pellet mounting areas are recessed or thinned to make a stair between the pellet mounting areas and the remaining area of the leads. The wall of the stair can be utilized for light reflection.

Still further, a pair of convex lenses can be formed concurrently at the time of resin molding without providing an opening on the bridge portion.

BRIEF DESCRIPTION OF THE DRAWINGS

FIG. 1A and FIG. 1B are a perspective view and a cross-sectional view of a photointerrupter having a resin-molded single package proposed by a prior art.

FIG. 2 is a perspective view showing a surface appearance of a photointerrupter given in a first embodiment of the invention.

DESCRIPTION OF THE PREFERRED EMBODIMENTS

Figure 3A:
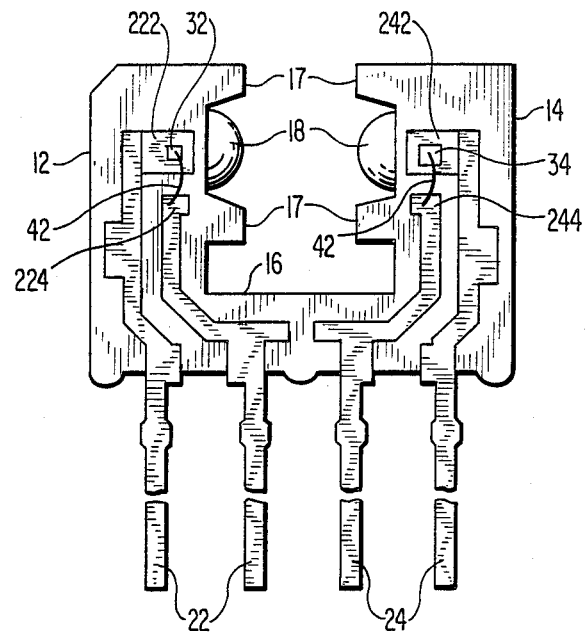
FIG. 3A, FIG. 3B and FIG. 3C are a front view, a top view and a right side view respectively of FIG. 1.
Figure 3B:
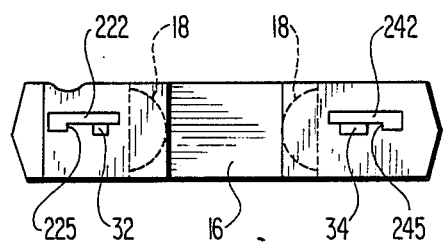
Figure 3C:
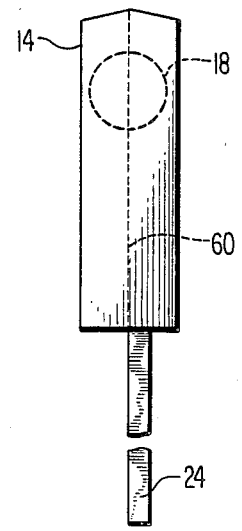

As will be apparent from FIG. 2 and FIG. 3A to 3C, all leads are arrayed on the same plane, one electrode (not shown for purposes of clarify) of a emitter pellet 32 is mounted on a mounting area 222 at a tip end of a lead 22 and connected electrically thereto, and the other electrode (not shown) of the emitter pellet 32 is connected electrically to the other tip end 224 of the emitter lead 22 through a bonding wire 42. Similarly, one electrode of a detector pellet 34 is mounted on a pellet mounting area 242 of a detector lead 24, and the other electrode is connected electrically to a tip end 244 of the other detector lead. Then, as will be apparent from FIG. 3A and FIG. 3B, the respective pellet mounting area of the leads is formed beforehand wide in width but thinner than a thickness of the adjacent lead in the example, thereby providing a stair wall at a boundary of the pellet mounting area and the remaining area of the lead. A component turning rearward out of the light coming from a side of the emitter pellet 32 is reflected by a stair wall portion 225, and likewise, a part of the light incident on the detector portion is reflected at a stair wall portion 245 of the detector lead 24 toward the detector pellet 34 to increase the quantity of incident light, thus contributing to an enhancement of the photocoupling efficiency.

As described hereinabove, since all the leads are arrayed on the same plane and both the pellet mounting areas are present also on the same plane, a thickness of the molding resin can be formed thin as compared with a conventional one. Further, all the leads 22, 24 can be derived from the same direction as illustrated, therefore a width of the photointerrupter or a dimension in the direction of optical axis can reasonably be minimized. Since all the leads are derived from the same plane in the same direction, a transfer molding technique using a two-split metal mold which is adaptable to mass production can easily be applied, and an opening larger than a diameter of the convex lens need not be provided any at the bridge portion 16 unlike the prior art given in FIG. 1, therefore the construction can be appreciated superior to the prior art in strength, too. As shown in FIG. 3A, the lead is partly extending over the bridge portion 16, thereby ensuring a mechanical strength even in case it is further thinned.

Where transfer molding is carried out by means of a two-split metal mold, a splice line of the two-split metal mold must be matched with the lead frame surface in the prior art shown in FIG. 1, and hence, as indicated by a dotted line 52, the metal mold must be split in a height direction, which may complicate a structure of the metal mold. However, in the case of the embodiment, the metal mold will be split perpendicularly of the photointerrupter, which may simplify the mold structure to an advantage. In FIG. 2 a splice line of the metal mold is indicated by a dotted line 60.

In the embodiment the emitter pellet 32 and the detector pellet 34 are disposed in a line on the same optical axis with the sides of both the pellets coming opposite to each other, therefore the optocoupling efficiency will deteriorate somewhat as compared with the case where principal surfaces of the pellets are disposed in face-to-face relationship, which may do no harm nevertheless practically. Particularly the light radiated from a side of the emitter pellet 32 through a convex lens 18 of the emitter portion 12 is converged and irradiated on the surface of a convex lens 18 of the detector portion 14, and is thus condensed on a portion having a maximum sensitivity of the side of the detector pellet 34, thereby serving satisfactorily to a practical use.

As a typical example of the invention given concretely here, a light emitting diode (LED) of gallium arsenide (GaAs) emitting infrared rays is used as the emitter pellet 32, and a phototransistor of silicon (Si) is used as the detector pellet 34. Each pellet is mounted on an a silver plated iron lead frame with silver paste. The pellets are then subjected to transfer molding after wire bonding by means of gold wire. An infrared ray transmissive visible light cut resin or, for example, a product named NT8513-9700 (manufactured by Nitto Electric Industrial Co., Ltd.) with visible light cutting dyestuff mixed in epoxy resin is used as the molding resin.

Referring to typical dimensions of each part, the resin-molded package is 11.0 mm in overall width (dimension in the direction of optical axis), 2.5 mm in thickness and 8.5 mm in height. Each convex lens 18 is semispherical and 2 mm in diameter. A distance between vertexes of both the convex lenses 18 is 3.0 mm. A height of protrusions 17 positioned vertically of the convex lenses 18 is selected to such degree as is equivalent to a radius of the convex lenses. The external leads are spaced one from the other regularly at 2.54 mm. The thickness of the pellet mounting areas of both the leads is 0.26 mm, while that of the remaining area of the leads is 0.46 mm. Thus the height of stair wall portions 225 and 245 is 0.2 mm. Since the thickness of the ordinary emitter pellet and detector pellet is about 0.2 mm, it is sufficient for the stair wall to act as a reflector. Another function of the recess located at the pellet mounting area is to match the optical axes of the emitter pellet and dector pellet with the central portion of convex lenses 18 when a joint surface of metal molds coincides with a principal surface of the lead frame.

Needless to say, the photointerrupter according to the present invention is not limited to the aforementioned materials and dimensions.

Figure 4A:
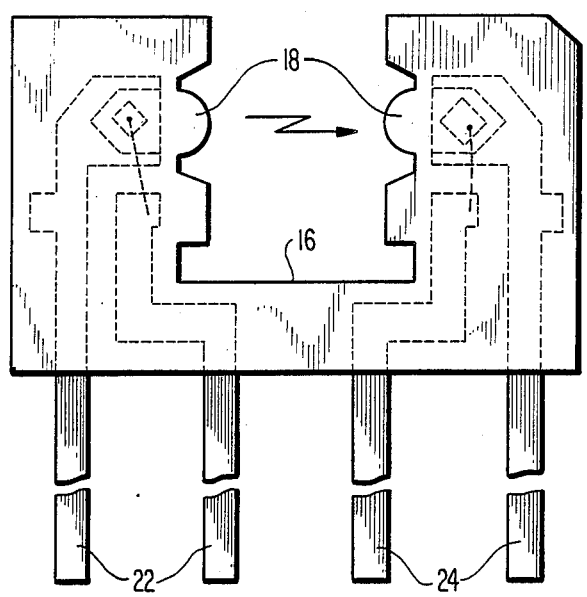
FIG. 4A and FIG. 4B are a front view and a plan view of a photointerrupter given in a second embodiment of the invention.
Figure 4B:
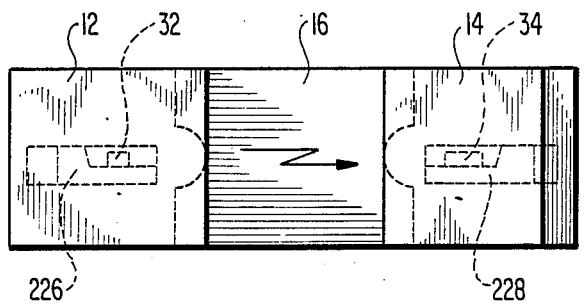

FIG. 4A and FIG. 4B are a front view and a plan view representing another embodiment of the invention. Like reference characters represent like parts in FIG. 2 and FIG. 3. What is different definitely from the foregoing embodiment is that pellet mounting areas of the leads take another form. A configuration is such that a recession shaped like a baseball home plate is formed in both mounting areas 226, 228, and thus the light coming from a side of the emitter pellet 32 is reflected toward the detector portion 14 more efficiently than in the case of the first embodiment. The light incident on the detector portion 14 is then reflected more efficiently than in the case of first embodiment and is easy to be incident on the detector pellet 34. In the second embodiment, two sides of both the rectangular pellets are inclined so as to be parallel with two sides of the recessions.

The recessions of the mounting areas according to the invention are formed concurrently at a stage of forming the lead frames by designing lead frame punch cutting die fittingly, therefore a manufacturing process will not be increased any thereby. Then, it is apparent that the lead frames can be formed not only through punching but also by a known art for etching.

The photointerrupter of the invention can be used under a disturbanceless environment where it is used, for example, in a blackbox, however, for use under a disturbed environment, it may be incorporated separately in a shading case for a higher reliability.

As described above, since the photointerrupter according to the invention can be formed thin and so miniaturized, it is capable of complying fully with the needs of the times as one of electronic parts to be designed thin and small. Further, since the lead need not be bent after mounting the pellet, a bending strain will never exert an influence on the pellet mounting area, thus obtaining a photointerrupter of high reliability. A manufacturing process can be facilitated and a quantity of needed resin can also be decreased according to the invention, and thus realized is such photointerrupter as is adaptable to mass production at a moderate cost.

What is claimed is:

1. A photointerrupter comprising: a first flat lead member having a first lead-out portion elongating substantially in a first direction and a first element mounting portion extending from one end of said first lead-out portion in a second direction substantially perpendicular to said first direction, said first element mounting portion having a major flat surface which is in parallel with a surface of said first lead-out portion and is positioned in a level lower than said surface of said first lead-out portion, a second flat lead member disposed on such side of said first flat lead member that said first element mounting portion is extended and having a second lead-out portion elongating substantially in said first direction and a second element mounting portion extending from one end of said second lead-out portion in said second direction toward said first element mounting portion, said second element mounting portion having a major flat surface which is in parallel with a surface of said second lead-out portion and is positioned in a level lower than said surface of said second lead-out portion, said major flat surface of said second element mounting portion and said major flat surface of said first element mounting portion being substantially in the same level, each of said first and second flat lead members having a reflective stair wall portion between the major flat surface of its element mounting portion and the surface of its lead-out portion, a third flat lead member disposed between said first and second lead members and having a third lead-out portion elongating along said first lead-out portion and substantially in said first direction and a first wire-bonding portion at one end of said third lead-out portion located adjacent to said first element mounting portion such that said first wire-bonding portion is spaced apart from said first element mounting portion in said first direction, a fourth flat lead member disposed between said second and third lead members and having a fourth lead-out portion elongating along said second lead-out portion and substantially in said first direction and a second wire-bonding portion at one end of said fourth lead-out portion located adjacent to said second element mounting portion such that said second wire-bonding portion is spaced apart from said second element mounting portion in said first direction, all of said first, second, third and fourth lead members being disposed substantially on the same plane, a light emitting element mounted on said major flat surface of said first element mounting portion such that one side end of said light emitting element is opposed to said reflective wall of said first lead member, a first bonding wire electrically connecting said light emitting element to said first wire-bonding portion, a light detecting element mounted on said major flat surface of said second element mounting portion such that one side end of said light detecting element is opposed to said reflective stair wall portion of said second lead member, a single packaging member commonly encapsulating said first, second, third and fourth lead members and said light emitting and light detecting elements such that a gap is formed between said first element mounting portion and second element mounting portion, a first convex lenses disposed between said first element mounting portion and said gap, and a second convex lenses disposed between said second element mounting portion and said gap, said first and second convex lenses being adapted to transfer the light emitted from the side end of said light emitting element to the side end of said light detecting element.

2. A photointerrupter, comprising:
a light emitting element mounted on an element mount surface of a first lead and connected electrically to a second lead,
a light detecting element mounted on an element mount surface of a third lead and connected electrically to a fourth lead, each of said light emitting element and light detecting element having a pair of major surfaces and side surfaces extending therebetween, one of said major surfaces being mounted on one of said element mount surfaces, and
a resin package commonly molding said light emitting element and light detecting element with said element mount surfaces of said first and third leads, both of said element mount surfaces being arranged substantially on the same plane, all of said first, second, third and fourth leads being supported only by said package and arranged in parallel on said plane and derived from one end surface of said package, said package having a slit to provide a predetermined air gap between said light emitting element and light detecting element, said package further having a pair of lenses provided on opposing walls of said slit such that the light emitted from said side surface of said light emitting element is directed mainly to said side surface of said light detecting element, through said air gap, said pair of lenses and said package being commonly formed by the same material which is transparent to the light emitted from said light emitting element.

3. A photointerrupter, comprising:
a light emitting element mounted on an element mount surface of a first lead and connected electrically to a second lead,
a light detecting element mounted on an element mount surface of a third lead and connected electrically to a fourth lead,
a single resin-molded package commonly housing said light emitting element and light detecting element with said first, second, third and fourth leads, said package having a slit of a predetermined air gap between said light emitting element and said light detecting element, said first, second, third and fourth leads being supported only by said package and positioned substantially on the same plane and derived from said package, said package further having a pair of convex lenses respectively provided on opposing walls of said slit, said element mount surfaces of said first and third leads being extended along said plane within said package so that the principal surfaces of said light emitting element and said light detecting element are arranged in side-by-side relationship and thereby directing the light emitted from the side end of said light emitting element toward the side end of said light detecting element through said air gap and convex lenses.

4. The photointerrupter as claimed in claim 3, wherein said first, second, third and fourth leads are all derived from the same plane of said package, and said all leads are arrayed on a straight line.

5. The photointerrupter as claimed in claim 3, wherein said element mount surfaces of said first and third leads are depressed to form stair walls for reflection.

6. A photointerrupter comprising: a light emitting element mounted on an element mount surface of a first lead and connected electrically to a second lead, a light detecting element mounted on an element mount surface of a third lead and connected electrically to a fourth lead, a single resin-molded package commonly housing said light emitting element and light detecting element with said first, second, third and fourth leads, said package having a slit of a predetermined air gap between said light emitting element and said light detecting element, said first, second, third and fourth leads being positioned substantially on the same plane and derived from said package, said element mount surfaces of said first and third leads being depressed to form stair walls for reflection and being extended along said plane within said package so that the principal surfaces of said light emitting element and said light detecting element are arranged in side-by-side relationship and thereby coupling the light emitted from the side end of said light emitting element to the side end of said light detecting element through said air gap.

* * * * *

UNITED STATES PATENT AND TRADEMARK OFFICE
CERTIFICATE OF CORRECTION

PATENT NO. : 4,933,729

DATED : JUNE 12, 1990

INVENTOR(S) : KATSUTOSHI SOEJIMA ET AL.

It is certified that error appears in the above-identified patent and that said Letters Patent is hereby corrected as shown below:

Column 4, line 31, delete "dector" insert --detector--.

Signed and Sealed this

Twenty-ninth Day of October, 1991

Attest:

HARRY F. MANBECK, JR.

Attesting Officer

Commissioner of Patents and Trademarks